United States Patent
Catabay et al.

(10) Patent No.: US 6,420,277 B1
(45) Date of Patent: Jul. 16, 2002

(54) PROCESS FOR INHIBITING CRACK FORMATION IN LOW DIELECTRIC CONSTANT DIELECTRIC FILMS OF INTEGRATED CIRCUIT STRUCTURE

(75) Inventors: Wilbur G. Catabay, Saratoga; Wei-Jen Hsia, Sunnyvale; Hong Qiang, Fremont, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/704,635

(22) Filed: Nov. 1, 2000

(51) Int. Cl.$^7$ .................. H01L 21/31; H01L 21/469
(52) U.S. Cl. ..................................... 438/763; 438/787
(58) Field of Search .......................... 438/158, 166, 438/593, 623, 624, 688, 720, 763, 787, 907, 634, 637, 652, 781

(56) References Cited

U.S. PATENT DOCUMENTS

| | | | |
|---|---|---|---|
| 3,012,861 A | 12/1961 | Ling ........................ | 23/223.5 |
| 3,178,392 A | 4/1965 | Kriner ....................... | 260/46.5 |
| 3,652,331 A | 3/1972 | Yamazaki ................... | 117/201 |
| 3,832,202 A | 8/1974 | Ritchie ....................... | 106/287 |
| 3,920,865 A | 11/1975 | Läufer et al. ................ | 427/220 |
| 4,705,725 A | 11/1987 | Glajch et al. ................ | 428/405 |
| 4,771,328 A | 9/1988 | Malaviya et al. ............. | 357/49 |
| 5,194,333 A | 3/1993 | Ohnaka et al. .............. | 428/405 |
| 5,314,845 A | 5/1994 | Lee et al. .................... | 437/238 |
| 5,364,800 A | 11/1994 | Joyner ........................ | 437/28 |
| 5,376,595 A | 12/1994 | Zupancic et al. ............. | 501/12 |
| 5,470,801 A | 11/1995 | Kapoor et al. .............. | 437/238 |
| 5,558,718 A | 9/1996 | Leung ..................... | 118/723 E |
| 5,559,367 A | 9/1996 | Cohen et al. ................. | 257/77 |
| 5,580,429 A | 12/1996 | Chan et al. ............ | 204/192.38 |

(List continued on next page.)

FOREIGN PATENT DOCUMENTS

| | | | |
|---|---|---|---|
| DE | 198 04 375 A1 | 7/1999 | ......... H01L/21/312 |
| EP | 0 706 216 A2 | 4/1996 | ......... H01L/23/532 |
| EP | 0 949 663 A2 | 10/1999 | ......... H01L/21/312 |
| JP | 63003437 | 1/1988 | ........... H01L/21/90 |
| JP | 2000-267128 | 9/2000 | ........... G02F/1/136 |
| WO | WO 99/41423 | 8/1999 | |

OTHER PUBLICATIONS

Koda, Seiichiro, et al., "A Study of Inhibition Effects for Silane Combusion by Additive Gases", *Combustion and Flame*, vol. 73, No. 2, Aug., 1988, pp. 187–194.

(List continued on next page.)

*Primary Examiner*—David Nelms
*Assistant Examiner*—Phuc T. Dang
(74) *Attorney, Agent, or Firm*—John P. Taylor

(57) ABSTRACT

A process is disclosed which inhibits cracking of the layer of low k silicon oxide dielectric material on an integrated circuit structure during subsequent processing of the layer of low k silicon oxide dielectric material. The process comprises: forming a layer of low k silicon oxide dielectric material on an integrated circuit structure on a semiconductor substrate, and forming over the layer of low k silicon oxide dielectric material a capping layer of dielectric material having: a dielectric constant not exceeding about 4, a thickness of at least about 300 nm, and a compressive stress of at least about $3 \times 10^9$ dynes/cm$^2$. In a preferred embodiment, the capping layer comprises silicon oxide formed by reaction of silane and $N_2O$ in a PECVD process carried out within a pressure range of from about 600 milliTorr to about 1000 milliTorr; and a temperature range of from about 300° C. to about 400° C.; while maintaining a plasma at a power level ranging from about 250 watts to about 350 watts; a flow of silane equivalent to a flow of from about 35 sccm to about 45 sccm into a 10 liter reactor; and a flow of $N_2O$ equivalent to a flow of from about 3800 sccm to about 4200 sccm into the 10 liter reactor.

21 Claims, 1 Drawing Sheet

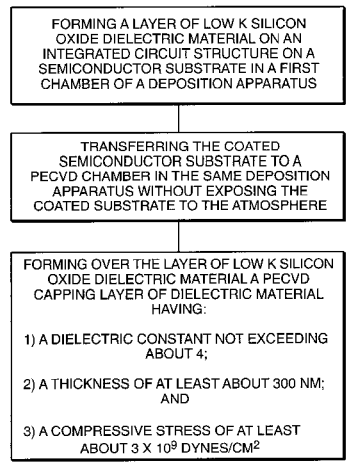

U.S. PATENT DOCUMENTS

| | | | |
|---|---|---|---|
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,847,461 A * | 12/1998 | Xu et al. | 257/751 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,939,763 A | 8/1999 | Hao et al. | 257/411 |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,066,574 A | 5/2000 | You et al. | 438/781 |
| 6,114,259 A | 9/2000 | Sukharev et al. | 438/789 |
| 6,147,012 A * | 11/2000 | Sukharev et al. | 438/787 |
| 6,153,524 A | 11/2000 | Henley et al. | 438/691 |
| 6,177,302 B1 * | 1/2001 | Yamazaki et al. | 438/158 |
| 6,204,192 B1 | 3/2001 | Zhao et al. | 438/723 |
| 6,232,658 B1 | 5/2001 | Catabay et al. | 257/701 |
| 6,245,666 B1 * | 6/2001 | Ko et al. | 438/623 |
| 6,316,354 B1 * | 11/2001 | Hu | 438/652 |

OTHER PUBLICATIONS

Bothra, S., et al., "Integration of 0.25 $\mu$m Three and Five Level Interconnect Sytem for High Performance ASIC", 1997 Proceedings Fourteenth International VMIC Conference, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", 1998 Proceedings Fourth International DUMIC Conference, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

* cited by examiner

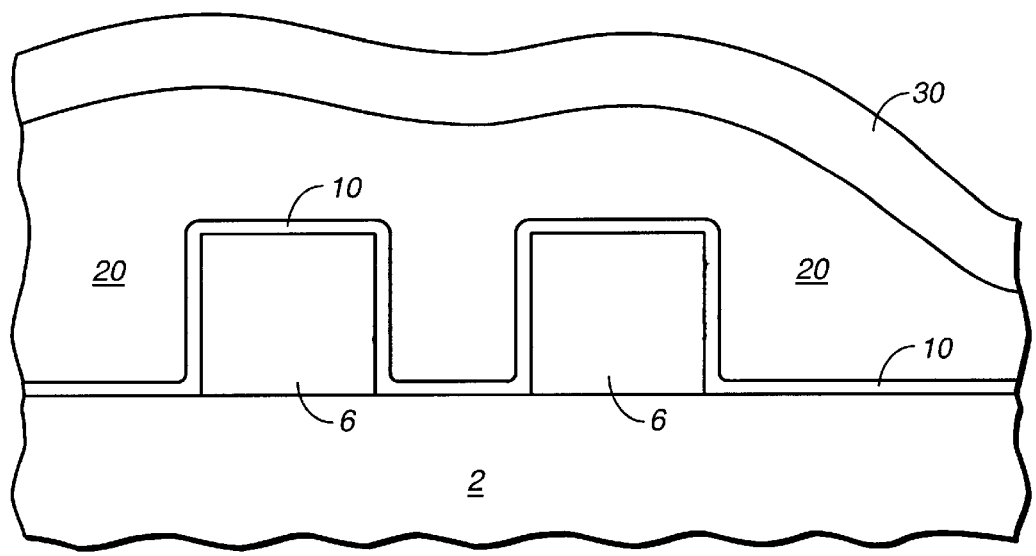

FIG._1

```
FORMING A LAYER OF LOW K SILICON
OXIDE DIELECTRIC MATERIAL ON AN
INTEGRATED CIRCUIT STRUCTURE ON A
SEMICONDUCTOR SUBSTRATE IN A FIRST
CHAMBER OF A DEPOSITION APPARATUS
```

```
TRANSFERRING THE COATED
SEMICONDUCTOR SUBSTRATE TO A
PECVD CHAMBER IN THE SAME DEPOSITION
APPARATUS WITHOUT EXPOSING THE
COATED SUBSTRATE TO THE ATMOSPHERE
```

```
FORMING OVER THE LAYER OF LOW K SILICON
OXIDE DIELECTRIC MATERIAL A PECVD
CAPPING LAYER OF DIELECTRIC MATERIAL
HAVING:

1) A DIELECTRIC CONSTANT NOT EXCEEDING
   ABOUT 4;

2) A THICKNESS OF AT LEAST ABOUT 300 NM;
   AND

3) A COMPRESSIVE STRESS OF AT LEAST
   ABOUT $3 \times 10^9$ DYNES/CM$^2$
```

FIG._2

PROCESS FOR INHIBITING CRACK FORMATION IN LOW DIELECTRIC CONSTANT DIELECTRIC FILMS OF INTEGRATED CIRCUIT STRUCTURE

BACKGROUND OF THE INVENTION

1. Field of the Invention

This invention relates to the formation of integrated circuit structures. More particularly, this invention relates to a process which inhibits cracking of a layer of low dielectric constant dielectric material on an integrated circuit structure.

2. Description of the Related Art

In the continuing reduction of scale in integrated circuit structures, both the width of metal interconnects or lines and the horizontal spacing between such metal lines on any particular level of such interconnects have become smaller and smaller. As a result, capacitance has increased between such conductive elements. This increase in capacitance results in loss of speed and increased cross-talk. As a result, reduction of such capacitance has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a chemical vapor deposition (CVD) process developed by Trikon Technologies of Newport, Gwent, U.K. The Trikon process is said to react methyl silane ($CH_3$—$SiH_3$) with hydrogen peroxide ($H_{O2}$) to form monosilicic acid which condenses on a cool wafer and is converted into an amorphous methyl-doped silicon oxide which is annealed at 400° C. to remove moisture.

The use of this type of low k material has been found to result in the formation of void-free filling of the high aspect ratio space between parallel closely spaced apart metal lines with dielectric material having a lower dielectric constant than that of convention silicon oxide, thereby resulting in a substantial lowering of the capacitance between such adjacent metal lines on the same metal wiring level.

The formation, from the reaction of silane ($SiH_4$) with hydrogen peroxide ($H_2O_2$), of a flowable polymer-like dielectric material capable of providing void-free filling of high aspect ratio regions between parallel closely spaced apart metal lines with dielectric material has been known in the prior art for some time. Dobson U.S. Pat. No. 5,874,367, filed Jun. 30, 1993, and issued on Feb. 23, 1999, describes the formation of such a polymer-like dielectric material and its use as a planarization material. Dobson describes the formation of a first underlayer described as an adhesion enhancer, and then the formation of a layer of the flowable dielectric material, which is initially subject to a reduced pressure heat treatment to remove water prior to subjecting the polymer to a more intense heat treatment to solidify the polymer. However, before the intense heat treatment, Dobson forms a capping layer over the polymer layer. The capping layer is said to assist in providing mechanical stability for the polymer layer during the cross linking which occurs as the polymer loses further water during the further heating. Dobson further states that the capping layer may also help to control the rate as which the layer looses water during such further heating and so may have a controlling affect on shrinkage and cracking.

An article published by Dobson et al. in the December 1994 edition of Semiconductor International, at pages 85–88, entitled "Advanced $SiO_2$ Planarization Using Silane and $H_2O_2$", further describes the formation of a planarizing layer of $SiO_2$ by the reaction of silane ($SiH_4$) with hydrogen peroxide ($H_2O_2$). The article further describes the formation of an underlayer of PECVD oxide and a capping layer of PECVD oxide. Both the underlayer and capping layer are said to be formed using a standard silane/nitrous oxide gas mixture. The capping layer of PECVD oxide is said to be 500 nanometers (nm) in thickness, and the authors report that the action of the capping layer reduces further the OH content of the flow layer and significantly improves the cracking resistance of the finished layer. Baking at 450° C. for 30 minutes is said to almost completely remove hydrogen-bonded OH groups, producing a homogeneous amorphous silicon dioxide film.

Subsequent to this, McClatchie et al., in a paper entitled "Low Dielectric Constant Oxide Films Deposited Using CVD Techniques" presented to the DUMIC Conference on Feb. 16–17, 1998, and published in the 1998 Proceedings Fourth International Dielectrics for ULSI Multilevel Interconnection Conference (DUMIC) at pages 311–318, described formation of a low dielectric constant (low k) dielectric material which also exhibits flowable properties and is formed by reacting a methyl silane ($CH_3SiH_3$) with hydrogen peroxide ($H_2O_2$). McClatchie et al. also describe the use of an underlayer and a capping layer with the flowable low k dielectric layer, stating that the underlayer functions as a moisture barrier and as an adhesion layer, while the capping layer is said to provide mechanical stability during the final anneal step.

The use of a moisture barrier layer beneath a flowable low k dielectric layer, formed by reacting a carbon-substituted silane with hydrogen peroxide, protects underlying materials, such as the silicon substrate or underlying metal lines, from exposure to the moisture and other reaction products formed and released as the flowable low k dielectric layer cures during high temperature annealing. However, it has been found, during the formation of vias and other openings through such low k dielectric material, that a low k dielectric material, formed by the reaction of carbon-substituted silane and hydrogen peroxide, may be sensitive to moisture and other chemicals, necessitating the need for a capping layer over the upper surface of the low k silicon oxide dielectric material to protect the otherwise exposed upper surface of the low k layer from such materials.

The use of such a protective capping layer, formed using dielectric materials such as silicon oxide or aluminum oxide, having (in the case of silicon oxide) either a conventional dielectric constant of about 4 or higher, or a low dielectric constant of 3.5 or lower, is described in copending U.S. Patent application Ser. Nos. 09/428,344; 09/590,310; 09/574,771; and 09/607,512; and in U.S. Pat. Nos. 6,114, 259 and 6,028,015; all assigned to the assignee of this invention. Furthermore, while not providing for capping layers per se thereon, copending U.S. patent application Ser. Nos. 09/425,552; 09/426,056; and 09/605,380; all assigned to the assignee of this invention, disclose the formation of a further oxide layer over a layer of low k silicon oxide dielectric material.

The problem of cracking of a layer of low k silicon oxide dielectric material is also known. Copending U.S. patent application Ser. No. 09/346,493, assigned to the assignee of this application, teaches the formation and individual annealing of a series of thin layers of low k silicon oxide dielectric material to change the residual stress in the composite layer to a compressive stress rather than tensile stress, since the normal tensile stress of the layer of low k silicon oxide dielectric material is considered to be likely to cause cracking of the layer of low k silicon oxide dielectric material.

Copending U.S. patent application Ser. No. 09/605,382, assigned to the assignee of this application, also recognizes the problem of cracking in layers of low k silicon oxide dielectric material and proposes to treat the material with hydrogen to reduce such cracking.

While it would be desirable to inhibit cracking of the layer of low k silicon oxide dielectric material by a capping layer of conventional silicon oxide having a compressive stress which would counter the tensile stress of the layer of low k silicon oxide dielectric material, the compressive stress of a ~50 nm (500 Angstrom) conventional silicon oxide capping layer (used as a protective layer to inhibit penetration of moisture and other chemicals to the underlying low k silicon oxide dielectric material) is typically only about $1\times10^9$ dynes/cm$^2$. To provide sufficient compressive stress needed to counter the tensile stress of the low k silicon oxide dielectric layer would require the use of a much thicker layer of conventional silicon oxide, possibly as high as 500 nm as reported by Dobson et al. for their capping layer over their layer of conventional (non-low k) flowable silicon oxide formed by reacting silane with hydrogen peroxide. However, the combination of high dielectric constant and thickness of such a capping layer of conventional silicon oxide would, in turn, negatively impact upon the overall dielectric constant of the composite layer of lower barrier layer, low k layer, and upper capping layer, since such a thick, high dielectric constant capping layer would comprise a considerable portion of the overall thickness of the composite layer.

It would, therefore, be desirable to provide a composite layer including a layer of low k silicon oxide dielectric material and a capping layer of silicon oxide wherein the tensile stress developed by the layer of low k silicon oxide dielectric material did not result in the cracking of the layer of low k silicon oxide dielectric material during subsequent annealing of the structure and the overall dielectric constant of the composite layer was not significantly raised by the presence of the capping layer.

SUMMARY OF THE INVENTION

The invention comprises a process which inhibits cracking of a layer of low k silicon oxide dielectric material on an integrated circuit structure during subsequent processing of the layer of low k silicon oxide dielectric material. The process comprises: forming a layer of low k silicon oxide dielectric material on an integrated circuit structure on a semiconductor substrate; and forming over the layer of low k silicon oxide dielectric material a capping layer of dielectric material having: a dielectric constant not exceeding about 4; a thickness of at least about 300 nm; and a compressive stress of at least about $3\times10^9$ dynes/cm$^2$.

BRIEF DESCRIPTION OF THE DRAWINGS

FIG. 1 is a fragmentary vertical cross-sectional view of an integrated circuit shown formed with a layer of tensile stressed low k dielectric material formed thereon with a capping layer of compressively stressed non-low k dielectric material formed over the low k layer.

FIG. 2 is a flowsheet illustrating the process of the invention.

DETAILED DESCRIPTION OF THE INVENTION

The invention comprises a process which inhibits cracking of a layer of low k silicon oxide dielectric material on an integrated circuit during subsequent processing of the layer of low k silicon oxide dielectric material. The process comprises: forming a layer of low k silicon oxide dielectric material on an integrated circuit structure on a semiconductor substrate; and forming over the layer of low k silicon oxide dielectric material a capping layer of dielectric material having: a dielectric constant not exceeding about 4; a thickness of at least about 300 nm; and a compressive stress of at least about $3\times10^9$ dynes/cm$^2$.

Turning now to FIG. 1, an integrated circuit structure formed on a silicon semiconductor substrate is generally indicated at 2. The upper surface of integrated circuit structure 2 may comprise exposed silicon portions and/or metal surfaces such as, for example, a lower level of metal interconnects, as shown by raised spaced apart metal lines 6. To protect such exposed surfaces, and provide a barrier layer between the integrated circuit structure and the layer of low k dielectric material to be formed thereon, a lower barrier layer 10 may be formed over integrated circuit structure 2. Lower barrier layer 10, which may also facilitate adhesion of the integrated circuit structure and the layer of low k dielectric material to be formed thereon, may comprise a conventional (non-low k) PECVD silicon oxide layer deposited on integrated circuit structure 2 to a thickness of about 50 nm. The presence of lower barrier layer 10 will serve to protect the underlying integrated circuit structure 2, including metal lines 6, from moisture and other reaction residues which will be released during the curing of the layer of low k dielectric material to be formed over lower barrier layer 10.

Over lower barrier layer 10 is then formed layer 20 of low k silicon oxide dielectric material. The term "low k", as used herein, is intended to define a dielectric constant of a dielectric material of 3.5 or less. Preferably, the dielectric constant of a "low k" material will be 3.0 or less. Layer 20 of low k silicon oxide dielectric material may be deposited over lower barrier layer 10 by reacting hydrogen peroxide with a carbon-substituted silane such as methyl silane, as described in the aforementioned article by L. Peters, and described in general for silane and peroxide reactions in Dobson U.S. Pat. No. 5,874,367, the subject matter of which is hereby incorporated by reference. The void-free low k silicon oxide dielectric material may also be deposited by reacting a mild oxidant such as hydrogen peroxide with the carbon-substituted silane materials disclosed in Aronowitz et al. Serial No. 09/274,457, filed on Mar. 22, 1999, and assigned to the assignee of this application, the subject matter of which is also hereby incorporated by reference. The process of the invention may also be useful with any other low k dielectric material having a high tensile stress, but will be described herein with respect to a high tensile stress low k carbon-substituted silicon oxide dielectric material by way of illustration and not of limitation.

The thickness of layer 20 of low k carbon-substituted silicon oxide dielectric material will vary with the application. In one embodiment, for example, the thickness of layer 20 may equal that of the height of the underlying metal lines to ensure that the horizontal space between adjacent lines is filled with low k dielectric material to reduce the horizontal capacitance between adjacent metal lines. The thickness of layer 20 of low k carbon-substituted silicon oxide dielectric material may vary from 300 nm to about 700 nm, but typically will be about 600 nm.

In accordance with the invention, a compressively stressed silicon oxide capping layer 30 is then formed over layer 20 of low k carbon-substituted silicon oxide dielectric material to compensate for the tensile stress of low k layer 20, as well as provide a moisture barrier for the upper surface of low k layer 20. Capping layer 30 preferably comprises a silicon oxide layer having a dielectric constant not exceeding about 4; a thickness of at least about 300 nm, and typically ranging from about 300 nm to about 400 nm; and a compressive stress of at least about $3 \times 10^9$ dynes/cm$^2$, and typically ranging from about $3 \times 10^9$ dynes/cm$^2$ to about $4 \times 10^9$ dynes/cm$^2$. The minimum thickness of at least about 300 nm is needed to provide a capping layer having sufficient compressive stress to compensate for the tensile stress of the underlying low k dielectric layer and will be sufficient to prevent diffusion of moisture through capping layer 30 to low k layer 20.

The maximum thickness of about 400 nm relates to the higher dielectric constant of the capping layer and the desire to keep the combined dielectric constant of the composite of dielectric layers (lower barrier layer, low k layer, and capping layer) as low as possible. Other dielectric material such as silicon nitride may be substituted for silicon oxide as the capping layer provided that they meet the about criteria regarding dielectric constant, thicknesses, and compressive stress.

To form a silicon oxide capping layer with a dielectric constant this low and compressive stress this high, and in this range of capping layer thickness, in accordance with the invention, capping layer 30 may be formed by the reaction of silane and N$_2$O in a plasma enhanced chemical vapor deposition (PECVD) reaction carried out in a vacuum chamber maintained at a pressure of from about 600 milliTorr to about 1000 milliTorr, preferably from about 700 milliTorr to about 900 milliTorr, and typically about 800 milliTorr; and a temperature ranging from about 300° C. to about 400° C., preferably from about 325° C. to about 375° C., and typically about 350° C. The plasma power, during the reaction to form capping layer 30 of silicon oxide, is maintained at a level of from about 250 watts to about 350 watts, preferably from about 275 watts to about 325 watts, and typically at about 300 watts.

The reaction may be carried out by flowing the reactants into a PECVD chamber at a rate equivalent to flowing the reactants into a 10 liter chamber, containing a 200 mm diameter substrate, of from about 35 standard cubic centimeters per minute (sccm) to about 45 sccm silane, typically about 40 sccm; and N$_2$O at a rate of from about 3800 sccm to about 4200 sccm typically about 4000 sccm. The plasma is ignited and then maintained within the power range once flow of the reactants has commenced. The flow of reactants and the plasma are maintained in the reactor until the desired thickness of the deposit has been achieved, after which the flow is shut off and the plasma is extinguished. Typically, for a thickness of about 300 nm, the above reaction will be carried out for from about 80 to about 90 seconds. The actual flow rates and reaction times to achieve the desired thickness of silicon oxide capping layer will depend on chamber size and wafer diameter.

Since it is important that moisture not penetrate into low k dielectric layer 20 prior to forming capping layer 30 thereon, in a preferred embodiment, capping layer 30 is formed over low k dielectric layer 20 without exposing the surface of low k dielectric layer 20 to the atmosphere. In a particularly preferred embodiment, the process steps of depositing low k dielectric layer 20 and capping layer 30 are carried out in the same apparatus, for example, by forming low k dielectric layer 20 in a chamber specifically designed to deposit low k dielectric material such as, for example, low k carbon-substituted silicon oxide dielectric material. After formation of low k layer 20 over integrated circuit structure 10, the substrate is moved, under vacuum, to a second chamber, such as a PECVD chamber or a HDP chamber where capping layer 30 is formed over low. k layer 20. Such a multiple chamber apparatus, sometimes also known as a cluster tool, is commercially available from various sources such as the Applied Materials Producer, the Trikon Technology fxp, or the Novellus Concept Two Sequel.

The following example will serve to illustrate the process of the invention. Three 200 mm diameter silicon wafer substrates having identical integrated circuit structures formed thereon can be placed (consecutively—not together) in a 10 liter PECVD chamber of a multiple chamber vacuum apparatus maintained at a pressure of 1400 milliTorr and a temperature of ~350° C. Silane is flowed into the chamber at a rate of 150 sccm and N$_2$O is flowed into the chamber at 3500 sccm. A plasma is ignited in the chamber and maintained at a power level of about 100 watts for the deposition time of 13 seconds, after which the plasma would be extinguished and the flow of reactant gases shut off, resulting in the deposition of about 50 nm of a lower barrier layer of silicon oxide over the integrated circuit structure previously formed over each of the silicon wafers.

The three identically coated wafers are then each transferred (separately) under vacuum to a 10 liter CVD chamber in the same apparatus where a 300 nm layer of low k silicon oxide dielectric material can be deposited over the lower barrier layer by flowing 70 sccm of methyl silane gas and 0.75 grams/minute of hydrogen peroxide vapor into the chamber for 40 seconds while maintaining a pressure of 900 milliTorr and a temperature of 5° C. in the chamber. The flow of reactants is then shut off. Without exposing the exposed low k surfaces to the atmosphere, two of the coated wafers are then transferred back to the PECVD chamber for formation of a capping layer thereon.

The PECVD chamber of the multiple chamber vacuum apparatus is maintained at a pressure of 800 milliTorr and a temperature of ~350° C. during the formation of the silicon oxide capping layer over the low k dielectric layer on the two wafers. Silane is flowed into the chamber at a rate of about 40 sccm and N$_2$O is flowed into the chamber at about 4000 sccm. A plasma is ignited in the chamber and maintained at a power level of about 300 watts for the entire deposition. One of the wafers is subjected to these deposition conditions for about 15 seconds, while the deposition time for the other wafer is about 84 seconds, after which (for each of the two wafers) the plasma would be extinguished and the flow of reactant gases shut off. The thickness of the capping layer on the wafer having a 15 second deposit time will measure about 50 nm, wile the thickness of the capping layer having the 84 second deposit time will measure about 300 nm.

Each of the three wafers can then be placed in an annealing furnace at a temperature of about 400° C. for a period of about 3 minutes. Each wafer is then removed, cooled to ambient temperature, and examined under a 200X microscope for cracking of the low k dielectric layer. Both the wafer without the capping layer and the wafer with the 50 nm capping layer will be found to have cracked during the high temperature anneal, while the wafer having the 300 nm capping layer will not exhibit cracking of the low k dielectric layer. If the tensile stress of the 300 nm thick capping layer is measured, it will be found to range between ~3–4×10$^9$ dynes/cm$^2$. If the dielectric constant (k) of the capping layer is also measured, it will be found to be about 4.

Thus, the process of the invention results in the prevention of cracking in a low k dielectric layer during annealing at an elevated temperature, without an unacceptable increase in the dielectric constant of the composite layer, by the formation, over the low k dielectric layer, of a capping layer such as silicon oxide having a thickness of at least about 300 nm, a dielectric constant not exceeding about 4, and a compressive stress of at least about 3×10$^9$ dynes/cm$^2$.

What is claimed is:

1. A process which inhibits cracking of a layer of low k silicon oxide dielectric material on an integrated circuit structure during subsequent processing of said layer of low k silicon oxide dielectric material which comprises:
   a) forming a layer of low k silicon oxide dielectric material on an integrated circuit structure on a semiconductor substrate; and
   b) forming over said layer of low k silicon oxide dielectric material a capping layer of dielectric material having:
      1) a dielectric constant not exceeding about 4;
      2) a thickness of at least about 300 nm; and
      3) a compressive stress of at least about 3×10$^9$ dynes/cm$^2$.

2. The process of claim 1 wherein said capping layer thickness ranges from about 300 nm to about 400 nm.

3. The process of claim 1 wherein said capping layer has a compressive stress greater than 3×10$^9$ dynes/cm$^2$.

4. The process of claim 1 wherein said capping layer has a compressive stress ranging from about 3×10$^9$ dynes/cm$^2$ to about 4×10$^9$ dynes/cm$^2$.

5. The process of claim 1 wherein said capping layer comprises silicon oxide.

6. The process of claim 5 wherein said silicon oxide capping layer is formed by reaction of silane and N$_2$O in a PECVD process.

7. The process of claim 6 wherein said silicon oxide capping layer is formed by reaction of silane and N$_2$O in a PECVD process carried out within a pressure range of from about 600 milliTorr to about 1000 milliTorr.

8. The process of claim 6 wherein said silicon oxide capping layer is formed by reaction of silane and N$_2$O in a PECVD process carried out within a temperature range of from about 300° C. to about 400° C.

9. The process of claim 6 wherein said silicon oxide capping layer is formed by reaction of silane and N$_2$O in a PECVD process carried out while maintaining a plasma at a power level ranging from about 250 watts to about 350 watts.

10. The process of claim 6 wherein said silicon oxide capping layer is formed by reaction of silane and N$_2$O in a PECVD process carried out while maintaining a flow of silane equivalent to a flow of from about 35 sccm to about 45 sccm into a 10 liter reactor.

11. The process of claim 6 wherein said silicon oxide capping layer is formed by reaction of silane and N$_2$O in a PECVD process carried out while maintaining a flow of N$_2$O equivalent to a flow of from about 3800 sccm to about 4200 sccm into a 10 liter reactor.

12. The process of claim 6 wherein said silicon oxide capping layer is formed by reaction of silane and N$_2$O in a PECVD process carried out within a pressure range of from about 600 milliTorr to about 1000 milliTorr; and a temperature range of from about 300° C. to about 400° C.; while maintaining a plasma at a power level ranging from about 250 watts to about 350 watts; a flow of silane equivalent to a flow of from about 35 sccm to about 45 sccm into a 10 liter reactor; and a flow of N$_2$O equivalent to a flow of from about 3800 sccm to about 4200 sccm into said 10 liter reactor.

13. The process of claim 12 wherein said process for forming said silicon oxide capping layer is carried out for a period of time equivalent to at least about 80 seconds for a 200 mm diameter wafer to form said capping layer to a thickness of at least about 300 nm.

14. The process of claim 1 wherein said first and second steps are carried out without exposing said semiconductor substrate to the atmosphere between said steps.

15. A process which inhibits cracking of said layer of low k silicon oxide dielectric material on an integrated circuit structure during subsequent processing of said layer of low k silicon oxide dielectric material which comprises:
   a) forming in a first chamber of an apparatus a layer of low k silicon oxide dielectric material on an integrated circuit structure on a semiconductor substrate;
   b) transferring said substrate to a second chamber in said apparatus without exposing said layer of low k silicon oxide dielectric material to the atmosphere; and
   c) forming in said second chamber over said layer of low k silicon oxide dielectric material a capping layer of silicon oxide dielectric material having:
      1) a dielectric constant not exceeding about 4;
      2) a thickness of at least about 300 nm; and
      3) a compressive stress of at least about 3×10$^9$ dynes/cm$^2$.

16. The process of claim 15 wherein said silicon oxide capping layer is formed by reaction of silane and N$_2$O in a PECVD process carried out within a pressure range of from about 700 milliTorr to about 900 milliTorr.

17. The process of claim 15 wherein said silicon oxide capping layer is formed by reaction of silane and N$_2$O in a PECVD process carried out within a temperature range of from about 325° C. to about 375° C.

18. The process of claim 15 wherein said silicon oxide capping layer is formed by reaction of silane and N$_2$O in a PECVD process carried out while maintaining a plasma at a power level ranging from about 275 watts to about 325 watts.

19. The process of claim 15 wherein said silicon oxide capping layer is formed by reaction of silane and N$_2$O in a PECVD process carried out while maintaining a flow of silane equivalent to a flow of from about 35 sccm to about 45 sccm into a 10 liter reactor, and a flow of N$_2$O equivalent to a flow of from about 3800 sccm to about 4200 sccm into said 10 liter reactor.

20. The process of claim 15 wherein said silicon oxide capping layer is formed by reaction of silane and N$_2$O in a PECVD process carried out within a pressure range of from about 700 milliTorr to about 900 milliTorr; and a temperature range of from about 325° C. to about 375° C.; while maintaining a plasma at a power level ranging from about 275 watts to about 325 watts; a flow of silane equivalent to a flow of from about 35 sccm to about 45 sccm into a 10 liter reactor; and a flow of N$_2$O equivalent to a flow of from about 3800 sccm to about 4200 sccm into said 10 liter reactor.

21. A process which inhibits cracking of a layer of low k silicon oxide dielectric material on an integrated circuit structure during subsequent processing of said layer of low k silicon oxide dielectric material which comprises:
   a) forming in a first chamber of an apparatus a layer of low k silicon oxide dielectric material on an integrated circuit structure on a semiconductor substrate;

b) transferring said substrate to a second chamber in said apparatus without exposing said layer of low k silicon oxide dielectric material to the atmosphere; and c) forming in said second chamber over said layer of low k silicon oxide dielectric material a capping layer of silicon oxide dielectric material by reaction of silane and $N_2O$ in a PECVD process carried out within a pressure range of from about 700 milliTorr to about 900 milliTorr; and a temperature range of from about 325° C. to about 375° C.; while maintaining a plasma at a power level ranging from about 275 watts to about 325 watts; a flow of silane equivalent to a flow of from about 35 sccm to about 45 sccm into a 10 liter reactor; and a flow of $N_2O$ equivalent to a flow of from about 3800 sccm to about 4200 sccm into said 10 liter reactor;

whereby a capping layer of silicon oxide will be formed over said layer of low k silicon oxide dielectric material capable of inhibiting cracking of said layer of low k silicon oxide dielectric material during subsequent annealing of said substrate, said capping layer having:

a) a dielectric constant not exceeding about 4;

b) a thickness of at least about 300 nm; and c) a compressive stress of at least about $3 \times 10^9$ dynes/$cm^2$.

\* \* \* \* \*

UNITED STATES PATENT AND TRADEMARK OFFICE
CERTIFICATE OF CORRECTION

PATENT NO.   : 6,420,277 B1
DATED        : July 16, 2001
INVENTOR(S)  : Wilbur G. Catabay, Wei-Jen Hsia and Hong Qiang Lu It is certified that error appears in the above-identified patent and that said Letters Patent is hereby corrected as shown below:

<u>Title page,</u>
Item [75], Inventors, change "Hong Qiang" to -- Hong Qiang Lu --.

Signed and Sealed this

Twenty-seventh Day of August, 2002

*Attest:*

*Attesting Officer*

JAMES E. ROGAN
*Director of the United States Patent and Trademark Office*